United States Patent
Bellorado et al.

(10) Patent No.: US 9,240,245 B1
(45) Date of Patent: Jan. 19, 2016

(54) MEMORY EFFICIENT TRIGGERS OF READ DISTURB CHECKS IN SOLID STATE STORAGE

(71) Applicant: SK hynix memory solutions inc., San Jose, CA (US)

(72) Inventors: Jason Bellorado, San Jose, CA (US); Marcus Marrow, San Jose, CA (US); Derrick Preston Chu, Santa Clara, CA (US)

(73) Assignee: SK hynix memory solutions inc., San Jose, CA (US)

( * ) Notice: Subject to any disclaimer, the term of this patent is extended or adjusted under 35 U.S.C. 154(b) by 248 days.

(21) Appl. No.: 14/011,453

(22) Filed: Aug. 27, 2013

Related U.S. Application Data

(60) Provisional application No. 61/699,534, filed on Sep. 11, 2012.

(51) Int. Cl.
*G11C 16/34* (2006.01)

(52) U.S. Cl.
CPC .................................. *G11C 16/3422* (2013.01)

(58) Field of Classification Search
CPC .......... G11C 16/3422; G11C 16/3418; G11C 16/0483; G11C 16/10; G11C 16/3427; G11C 11/5628
See application file for complete search history.

(56) References Cited

U.S. PATENT DOCUMENTS

| | | | |
|---|---|---|---|
| 7,818,525 B1 * | 10/2010 | Frost et al. | 711/165 |
| 2008/0158971 A1 * | 7/2008 | Lee | 365/185.17 |
| 2008/0288814 A1 * | 11/2008 | Kitahara | 714/5 |
| 2012/0030506 A1 * | 2/2012 | Post et al. | 714/6.1 |

* cited by examiner

*Primary Examiner* — Albert Decady
*Assistant Examiner* — Kyle Vallecillo
(74) *Attorney, Agent, or Firm* — IP & T Group LLP

(57) ABSTRACT

An indication is received that a word line has been read. The word line is part of a plurality of word lines (in solid state storage) which is divided into a plurality of groups. It is determined which group is associated with the read. A count of consecutive, at least potentially uninformative reads is updated based at least in part on the group associated with the read and a group associated with a prior read. It is determining if the count is greater than a threshold and in the event it is determined the count is greater than the threshold, a read disturb check is triggered.

27 Claims, 13 Drawing Sheets

MEMORY EFFICIENT TRIGGERS OF READ DISTURB CHECKS IN SOLID STATE STORAGE

CROSS REFERENCE TO OTHER APPLICATIONS

This application claims priority to U.S. Provisional Patent Application No. 61/699,534 entitled EFFICIENT DETECTION OF READ-DISTURB IN NAND-BASED STORAGE DEVICES filed Sep. 11, 2012 which is incorporated herein by reference for all purposes.

BACKGROUND OF THE INVENTION

Read disturb occurs when a read is performed on a word line in solid state storage. Cells on word lines (other than the one being read) may have a small amount of charge inadvertently added to them during the read; typically, cells storing the lowest voltages in unread word lines are affected the most.

One technique to mitigate read disturb is to have a counter for each word line which counts the number of reads since the last P/E cycle. As such, they are incremented with each read, and reset when the block is erased and re-written. These counters have a number of drawbacks associated with them. A first issue is size. Typically, the size of these counters is relatively large, for example 20 bits per counter. If there are 64,000 blocks and there is a counter per block, then this is over 1 MB of information which must be stored. This amount of overhead information is undesirable. A second issue is the type of storage in which these counters must be stored. The counts have to be preserved even if the system is power cycled, so non-volatile storage must be used. In some cases, this means periodically "flushing" the current counts from volatile storage to non-volatile storage. Even if a power down is indicated beforehand, there may not be enough time to flush the current counts to non-volatile storage (e.g., because the system has a maximum power down time). Finally, as a result of variations in manufacturing processing, some solid state storage devices are more durable than others. P/E counters do not take manufacturing variations into account. New techniques related to read disturb which address some or all of these issues would be desirable.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
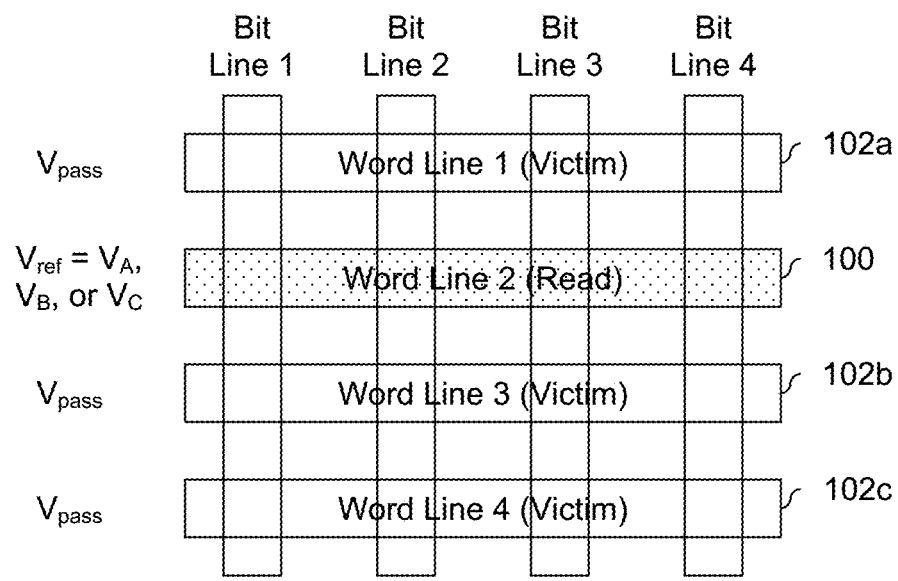
FIG. 1 is a diagram showing an embodiment of word lines in solid state storage.

FIG. 1 is a diagram showing an embodiment of word lines in solid state storage. In the example shown, there are 4 word lines and 4 bit lines (i.e., there are 16 cells total) and word line 2 (100) is being read. For clarity, a relatively small number of word lines and bit lines are shown in this and other examples. Naturally, the techniques described herein are applicable to any number of cells, word lines, bit lines, etc.

Word lines which are not being read are set to a pass voltage ($V_{pass}$). As such, word lines 1 and 3-4 (102a-102c) are set to $V_{pass}$ since they are not being read. $V_{pass}$ must be greater than the largest possible voltage written to the floating gate of any cell in the array. The word line which is being read (in this example, word line 100) is set to an appropriate read threshold, $V_{ref}$. Some read threshold examples are described in more detail below.

Read disturb occurs when electrons are inadvertently added to the floating gate of a cell during a read. This occurs because electrons "jump" to the floating gate voltage of a cell; the likelihood or ease of a jump tends to increase with the difference between the applied voltage (e.g., $V_{pass}$) and the voltage stored by the cell. As such, read disturb tends to victimize cells in word lines which are not being read (e.g., because cells in unread word lines have the highest voltages applied) and which store the lowest voltages because such cells have the largest voltage differences.

In examples described herein, cells are multi-level cells (MLC) which store 2 bits per cell. The following figure shows an example of an MLC histogram of voltage levels.

Figure 2:
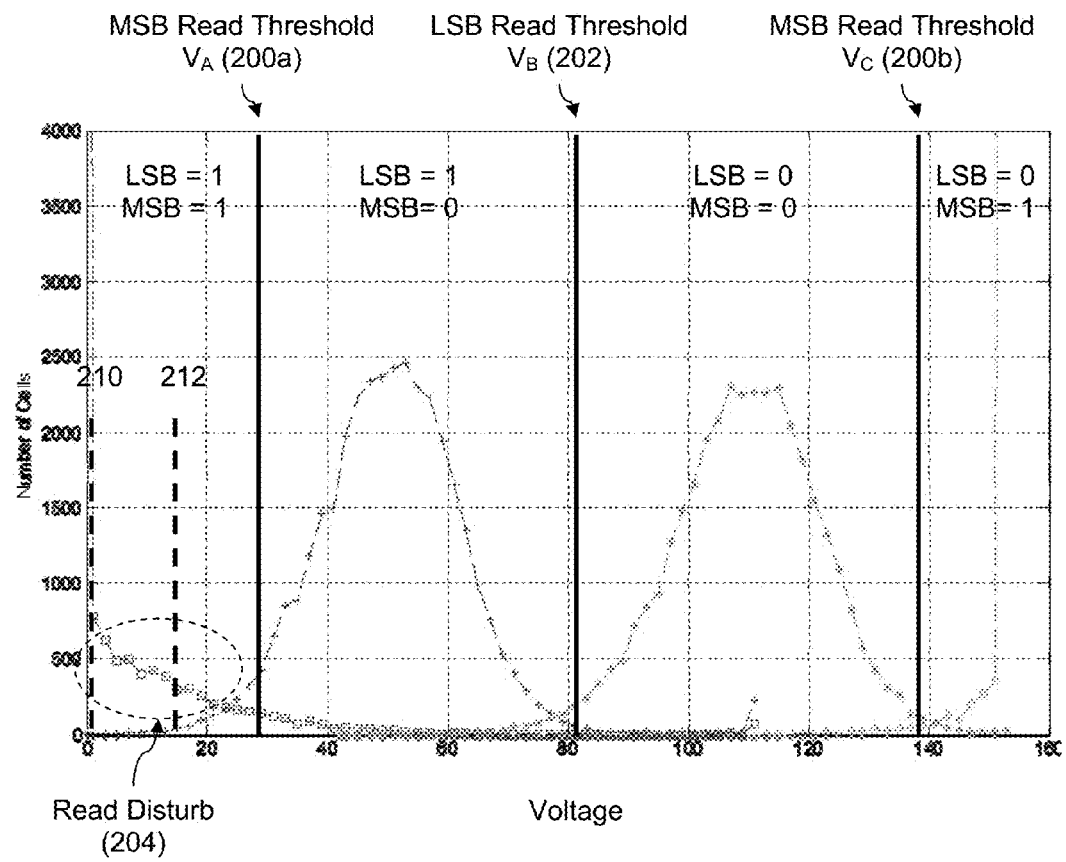
FIG. 2 is a diagram showing an embodiment of an MLC histogram of voltage levels stored by a group of cells.

FIG. 2 is a diagram showing an embodiment of an MLC histogram of voltage levels stored by a group of cells. In the example shown, read threshold 200a-200b are most significant bit (MSB) read thresholds and read threshold 202 is a least significant bit (LSB) read threshold because they (respectively) are used to read back the MSB and LSB values. Cells which store a voltage below read threshold 200a are interpreted or read back as having an LSB of 1 and an MSB of 1. Cells which store a voltage between read thresholds 200a and 202 are interpreted or read back as having an LSB of 1 and an MSB of 0. Cells which store a voltage between read thresholds 202 and 200b are interpreted or read back as having an LSB of 0 and an MSB of 0. Cells which store a voltage greater than read threshold 200b are interpreted or read back as having an LSB of 0 and an MSB of 1. Note that the LSB/MSB assignments shown herein are merely exemplary; any LSB/MSB assignment may be used (e.g., the MSB may have a single read threshold and the LSB may have two read thresholds).

For MLC cells, a read of a word line is either an MSB read or an LSB read. Returning to FIG. 1, if an MSB read is being performed on word line 100 then two reads are performed: one at $V_{ref}=V_A$ (i.e., read threshold 200a in FIG. 2) and one at $V_{ref}=V_C$ (i.e., read threshold 200b in FIG. 2) in order to obtain the MSB values of cells in word line 100. Note that the two reads may be performed in any order and/or this process of reading twice may be internal to the NAND. If an LSB read is performed on word line 100, then a single read at $V_{ref}=V_B$ (i.e., read threshold 202 in FIG. 2) is performed in order to obtain the LSB values of cells in word line 100.

Returning to FIG. 2, read disturb tends to affect those cells storing the lowest voltages, which in this case are the cells storing a 11. See read disturb region 204 which corresponds to cells storing the lowest voltages. As was described above, read disturb tends to affect cells storing the lowest voltages (in this case, a 11) because it is easier for an electron to make the jump to a floating gate of a cell if the difference between the applied voltage (e.g., $V_{pass}$) and the stored voltage (e.g., in the range $[0, V_A]$ for cells storing a 11) is greater. Cells storing a 11 which are not being read will have the greatest voltage difference and thus will have the most additional voltage added to it because of read disturb.

In some embodiments, information stored in a word line is error correction encoded. The following figure shows an example of error correction decoding performed on information read back from a word line.

Figure 3:
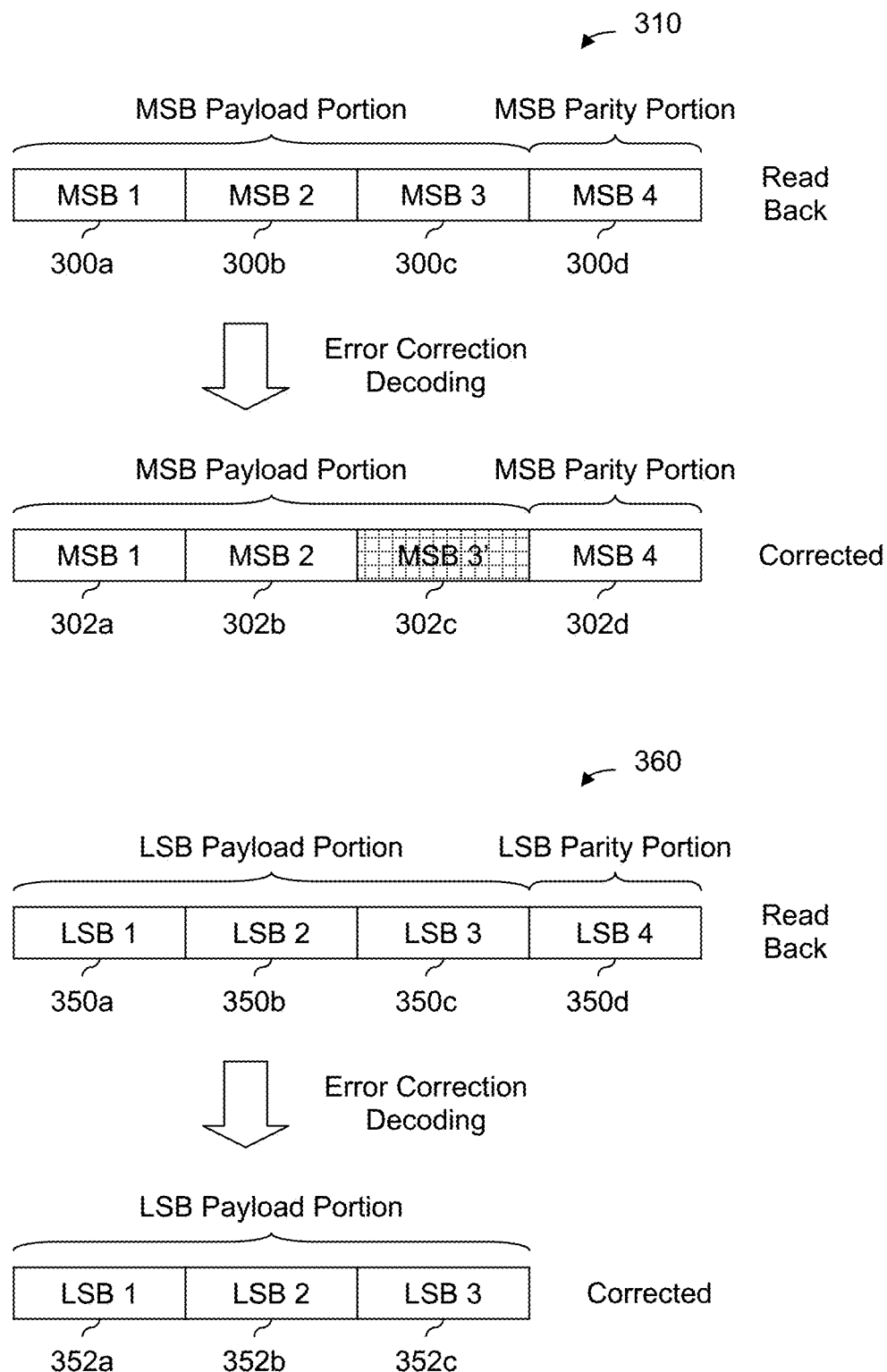
FIG. 3 is a diagram showing embodiments of data from an MSB page and an LSB page which are error correction decoded.

FIG. 3 is a diagram showing an embodiment of data from an MSB page and an LSB page which are error correction decoded. FIG. 3 continues the example of FIG. 1, so the length of a word line is 4 bits long. A word line refers to a (e.g., physical) group of cells. In MLC, 2 bits of information are written to the cells and those groups of bits are termed the LSB page and MSB page. The word line consists of both bits (i.e., the MSB(s) and LSB(s)) which are written to the (i.e., same) physical cells.

Diagram 310 shows an MSB example. In that example, an MSB read is performed which returns an MSB page (e.g., word line 100 in FIG. 1 is read twice: once with $V_{ref}=V_A$ and again with $V_{ref}=V_C$). Read back bits 300a-300c correspond to an MSB payload portion and read back bit 300d corresponds to an MSB parity portion. After error correction decoding, a corrected bit sequence is produced comprising bits 302a-302d. Corrected bits 302a-302b and 302d match their corresponding read back bits (i.e., those bits did not have to be "flipped" during error correction decoding) but bit 302c is corrected or flipped (i.e., read back bit 300c and corrected bit 302c are opposite values).

Diagram 360 shows an LSB example. If an LSB read is performed on word line 100 in FIG. 1 (e.g., a single read with $V_{ref}=V_B$) then an LSB page is returned. As in the MSB example, read back bits 350a-350c correspond to an LSB payload portion and read back bit 350d corresponds to an LSB parity portion. After error correction decoding, none of the bits had to be corrected or flipped (352a-352c).

One read disturb detection technique "piggybacks" off of normal or operational reads (e.g., initiated by a host or driver). To summarize this read disturb detection technique, if the number of corrected bits (e.g., $n_{corrected}=1$ in diagram 310 and $n_{corrected}=0$ in diagram 360) exceeds some threshold, then according to that technique, that page or word line probably has too much read disturb and the data in that page or word line is moved to another page or word line.

The problem with the read disturb detection technique described above is that not all types of reads are informative about read disturb. For example, an LSB read is not an informative read with respect to read disturb. Looking at FIG. 2, read disturb 204 affects cells storing a 11. The cells in read disturb 204 are nowhere near the voltage level of read threshold 202, which is the read threshold used during an LSB read. As such, read disturb will not contribute significantly to LSB errors and using the number of corrected LSB bits is not informative with respect to the amount of read disturb.

Another type of read which is not informative is when the same word line is read over and over, even if an MSB read is being performed. For example, suppose an MSB read is being performed over and over on word line 100 in FIG. 1. Since the word line being read (word line 100 in this example) is not affected by read disturb and the word lines which are not being read are the victims (word lines 102a-102c in this example), using the number of corrected bits from reading word line 100 over and over is not informative with respect to read disturb. This is being when word line 100 is read over and over, additional voltage from read disturb is being added to word lines 102a-102c, which are not the word lines which are being evaluated or tested. Word line 100, which is the word line being tested, does not have a significant amount of read disturb because word lines 102a-102c are not being read.

Thus, repeatedly reading the same word line over and over (even if MSB reads are being performed) is not informative with respect to read disturb.

To detect when too many of these uninformative reads have been performed in a row (in other words, the system is developing a blind spot with respect to read disturb), a count of consecutive, at least potentially uninformative reads is used. The following figure describes this in more detail.

Figure 4:
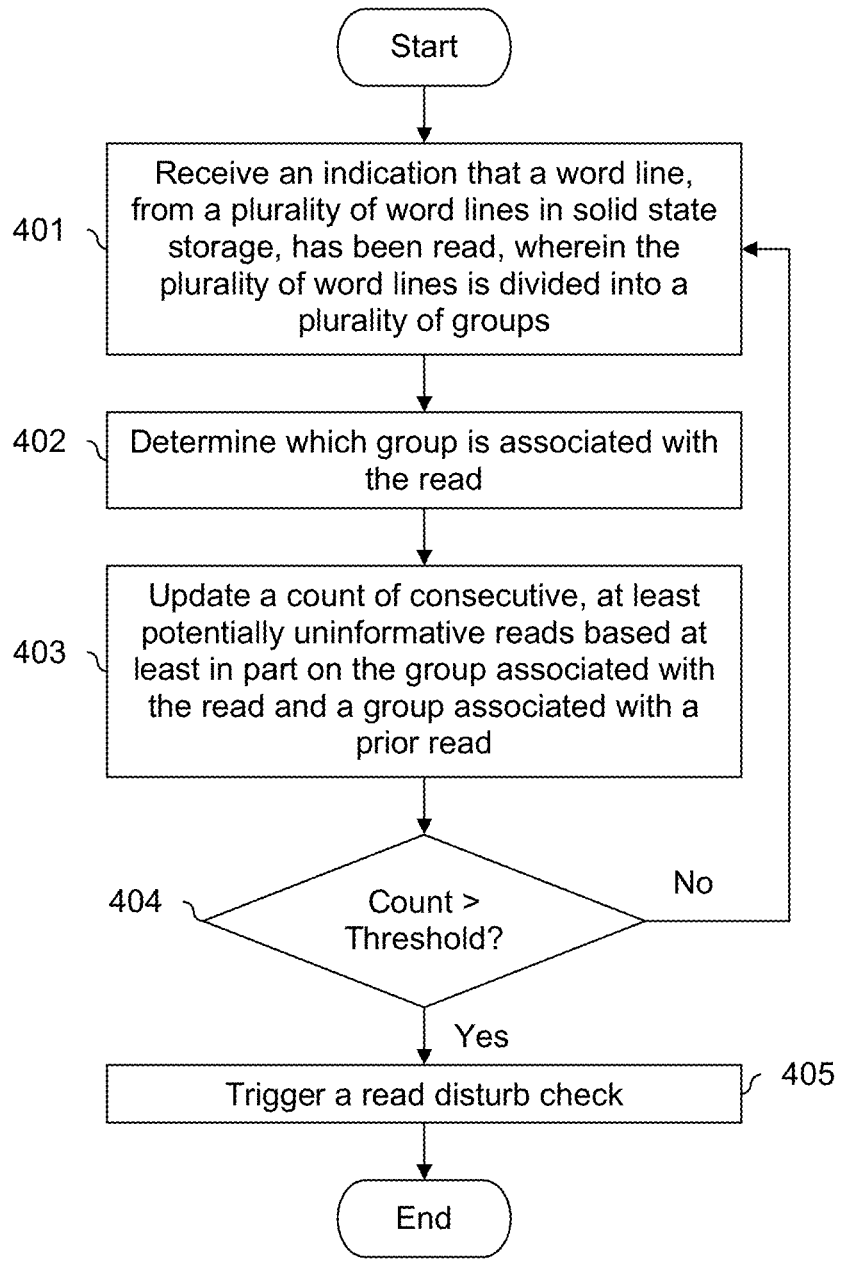
FIG. 4 is a flowchart illustrating an embodiment of a process for performing a read disturb check.

FIG. 4 is a flowchart illustrating an embodiment of a process for performing a read disturb check. In some embodiments, the process is performed by a read processor in a solid state storage controller (e.g., implemented on a semiconductor device, such as an application-specific integrated circuit (ASIC) or field-programmable gate array (FPGA)).

At 401, an indication is received that a word line, from a plurality of word lines in solid state storage, has been read, wherein the plurality of word lines is divided into a plurality of groups. For example, even word lines (e.g., those word lines having an address or offset which is an even number) may be assigned to one group and odd word lines are assigned to another group. In some embodiments, a read at 401 is a host or firmware initiated read. For example, a user or application may desire some data stored in solid state storage and the process of FIG. 4 piggybacks off of the host or firmware initiated read.

At 402, it is determined which group is associated with the read. To continue the example where word lines are divided into odd and even word lines, when a read is performed on word line W of block B, the bit $p_{new}$ is set to $p_{new}=\text{mod}(W, 2)$ where the mod(•) operation is mod(x,2)=

$$\text{mod}(x, 2) = \begin{cases} 0, & x \text{ even} \\ 1, & x \text{ odd} \end{cases}.$$

In other words, if an even word line is read, then $p_{new}=0$ and if an odd word line is read, then $p_{new}=1$.

At 403, a count of consecutive, at least potentially uninformative reads is updated based at least in part on the group associated with the read and a group associated with a prior read. In some embodiments, the count $c^B$ is updated at 403, where $c^B$ is a count of consecutive, at least potentially uninformative reads for block B. Another way of describing a read which is "at least potentially uninformative" is that it is either (1) a read which is known to be uninformative with respect to read disturb or (2) a read which is potentially uninformative with respect to read disturb. A read which is known to be informative with respect to read disturb is not counted at 403.

In one example of step 403, $p^B$ is used to track the group, for block B, which was read during the last informative read. To continue the example where word lines are divided into odd or even word lines, if $p^B=1$ then the last informative read was an MSB read of an odd word line in block B and if $p^B=0$ then the last informative read was an MSB read of an even word line in block B. In some embodiments, the bit $p^B$ is initialized to a random or arbitrary value (e.g., when the process is started and no informative reads have been performed). An example of step 403 is described in further detail below.

At 404, it is determined if the count is greater than a threshold. If the count is greater than the threshold, then a read disturb check is triggered at 405. Any read disturb check may be performed and the techniques described herein are not tied to any one particular read disturb check. If the count is not greater than the threshold at 404, then another indication is received at 401.

Figure 5:
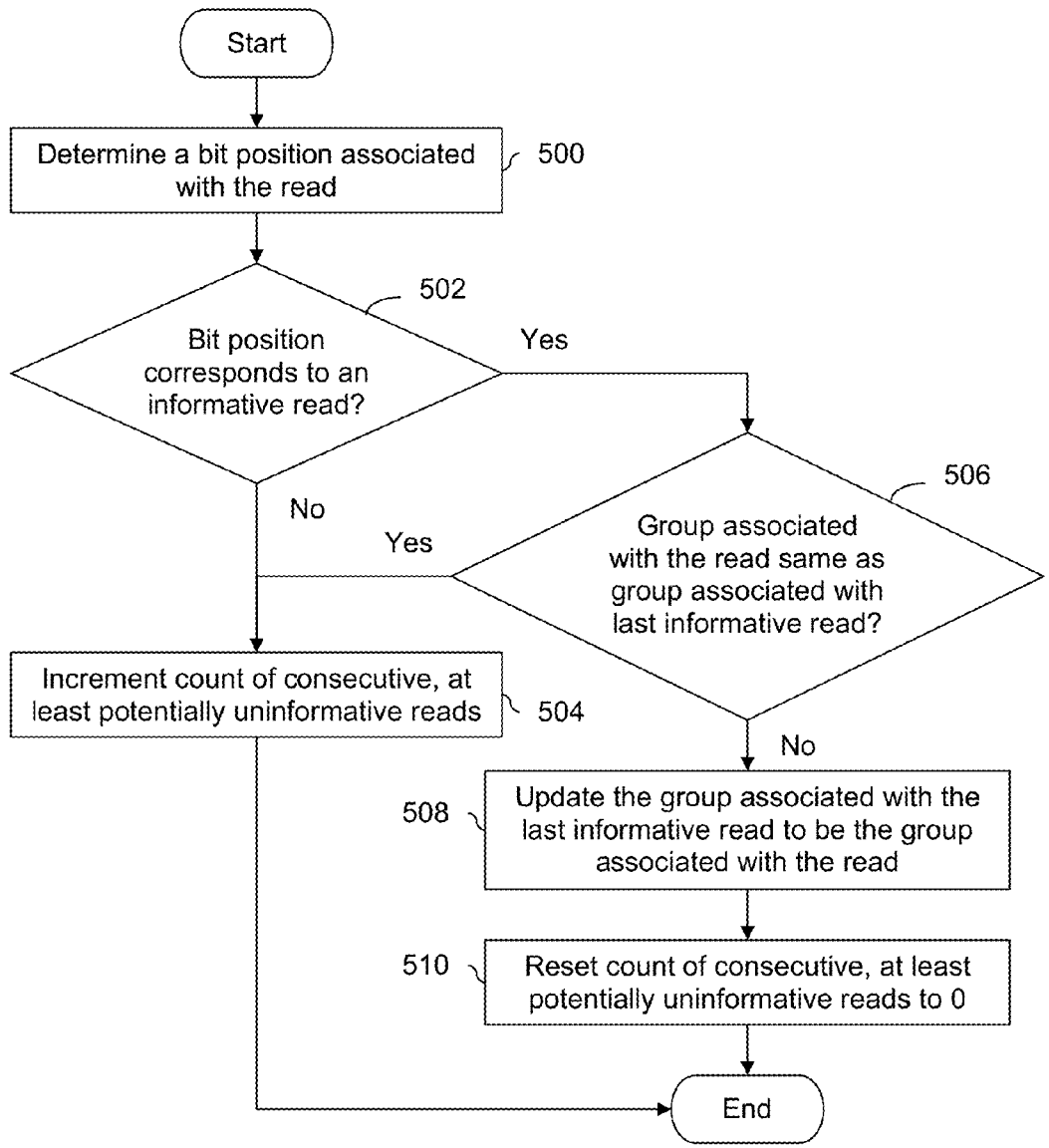
FIG. 5 is a flowchart illustrating an embodiment of a process for updating a count of consecutive, at least potentially uninformative reads.

FIG. 5 is a flowchart illustrating an embodiment of a process for updating a count of consecutive, at least potentially uninformative reads. In some embodiments, the example process is performed at step 403 in FIG. 4. At 500, a bit position associated with the read is determined. For example, in the case of a 2-bit MLC system, either an MSB read or an LSB read is performed.

At 502, it is determined if the bit position corresponds to an informative read. In the example of FIG. 2, an LSB read is an uninformative read (e.g., because LSB read threshold 202 is not near read disturb region 204) and an MSB read is an informative read (e.g., because read disturb region 204 is near read threshold 200a, which is an MSB read threshold).

If at 502 it is determined that the bit position does not correspond to an informative read, then a count of consecutive, at least potentially uninformative reads is incremented at 504. For example, if an LSB read is performed, then $c^B=c^B+1$. In other words, it is a necessary but not sufficient condition that an informative read is an MSB read (at least for the bit assignments in FIG. 2).

If at 502 it is determined that the bit position does correspond to an informative read, it is determined at 506 if the group associated with the read is the same as a group associated with a last informative read. For example, if $p_{new}=p^B$ then the decision at step 506 is yes; if $p_{new} \neq p^B$ then the decision at step 506 is no. The group associated with the last informative read at step 506 is one example of a group associated with a prior read from step 403 in FIG. 4.

If the groups are the same, then the count is incremented at 504. If the groups are not the same, then the group associated with the last informative read is updated to be the group associated with the read at 508. For example, $p^B=p_{new}$. At 510, the count of consecutive, at least potentially uninformative reads is reset to 0.

Figure 6:
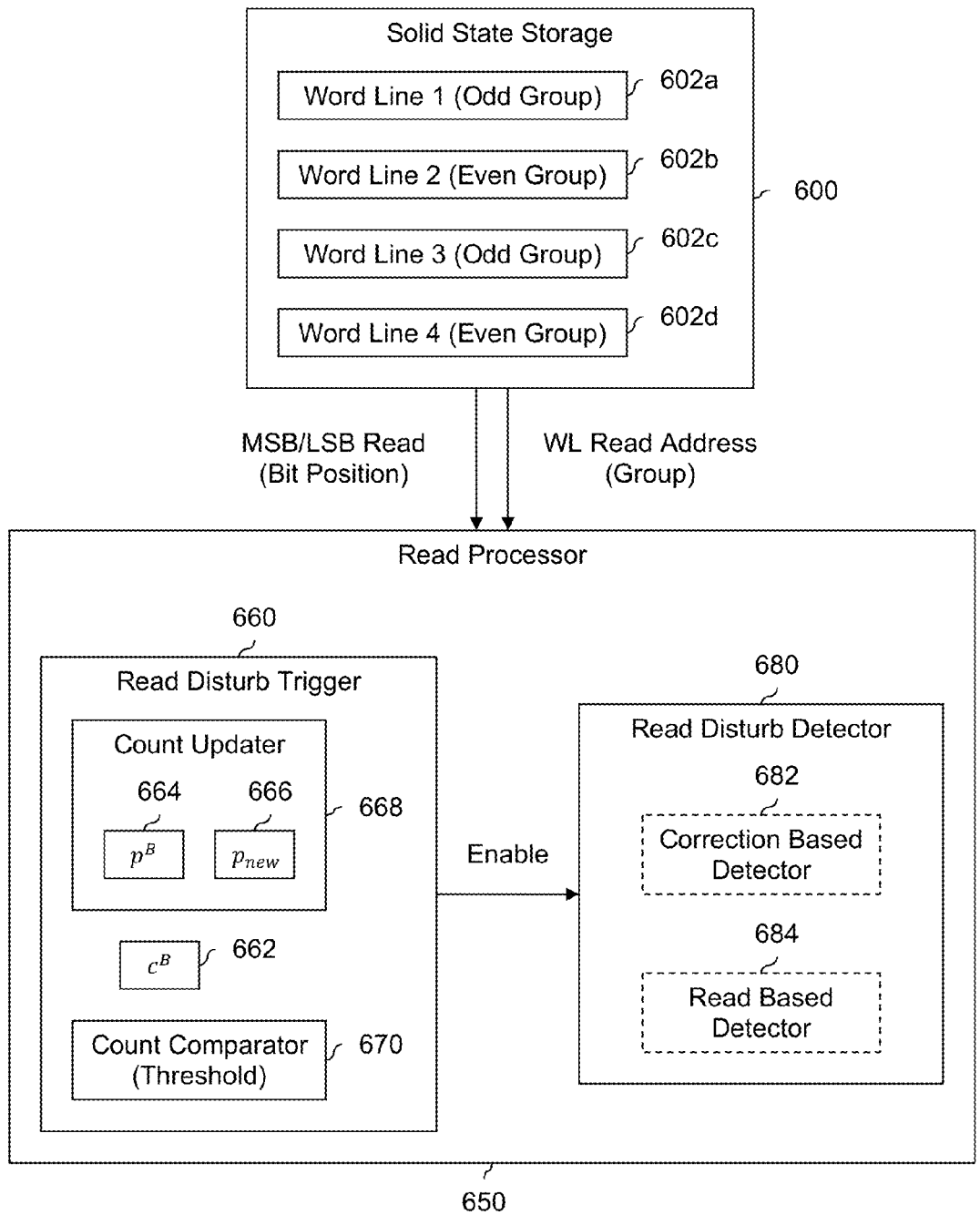
FIG. 6 is a diagram showing an embodiment of a solid state storage system which uses a count of consecutive, at least potentially uninformative reads to trigger read disturb detection.

FIG. 6 is a diagram showing an embodiment of a solid state storage system which uses a count of consecutive, at least potentially uninformative reads to trigger read disturb detection. In the example shown, read disturb trigger 660 performs the process described in FIG. 4. In this example, read processor 650 is implemented on or using an ASIC or FPGA.

In the example shown, solid state storage 600 includes word lines 602a-602d. The word lines are divided into odd and even groups so that word lines 602a and 602c are in one group and word lines 602b and 602d are in another group.

The word line read address and MSB/LSB read are passed from solid state storage 600 to read disturb trigger 660. From the word line read address, read disturb trigger 660 is able to determine the group associated with a read (e.g., even or odd) and from the MSB/LSB read, read disturb trigger 660 is able to determine a bit position associated with the read. Read disturb trigger 660 stores bit $p^B$ 664 and bit $p_{new}$ 666 (in count updater 668) which are used to update count $c^B$ 662. In this example, count $c^B$ 662 is a 4-bit counter.

Count comparator 670 compares count $c^B$ 662 against a threshold. When the count exceeds the threshold, an enable signal to read disturb detector 680 is asserted, which causes read disturb detector 680 to initiate read disturb detection. In one example, correction based detector 682 is used. First, an MSB read of the other group is used. For example, if $p^B=0$ (i.e., the last informative read was from the even group), then a word line from the odd group is randomly selected and an MSB read is performed on that randomly selected odd word line. The read back data is then passed to an error correction decoder (not shown) and a number of corrected bits in a payload portion (and/or a parity portion) is determined (see, e.g., FIG. 3). If the number of corrected bits exceeds some threshold (not shown) then that word line is determined to have too much read disturb and the data is moved to another word line. The read disturb detection process may continue for other word lines if read disturb is detected in the tested word line.

In another example, read based detector 684 is used. Generally speaking, the idea behind a read based detector is to determine how many cells are storing a non-zero but relatively low voltage by performing two reads at two different (but relatively low) read thresholds. For example, in FIG. 2, an MSB read is performed at read threshold 210 and then at read threshold 212. In this example, the word line which is read twice is randomly selected from the group which is oppose to $p^B$ (e.g., if $p^B=0$ then randomly select an odd word line) which is the same as in the above example. Then, the number of cells which flipped between those two MSB reads is determined (e.g., by finding the difference in the number of 1s read back with the different read threshold, or the difference in the number of 0s read back with the different read thresholds). This number indicates how many cells store a voltage between voltage 210 and voltage 212. A perfect distribution without any read disturb would look like a delta function which spikes just below 0 V, so if the number of cells between voltages 210 and 212 is greater than some threshold, it is determined that that word line has too much read disturb and the data is moved to another word line. As in the previous example, the read disturb detection process may go on to test other word lines if read disturb is detected in the tested word line.

Although other ways of grouping word lines 602a-602d exist, having word lines be assigned to alternating groups (e.g., even/odd groups) is desirable because it catches a sequential read. For example, suppose a song is stored in solid state storage in consecutive word lines. To play back the song, word lines are accessed in ascending or descending order; this is referred to as a sequential read. If (instead) the upper word lines were assigned to one group and the bottom word lines were assigned to another group, then a sequential read would be interpreted by read disturb trigger 660 as reading from the same group over and over and the count $c^B$ would be incremented with each read. In contrast, with an even group and an odd group, a sequential read would be interpreted by read disturb trigger as switching back and forth between the two groups, and fewer unnecessary read disturb checks would be triggered.

A benefit to using groups to increment the count $c^B$ is that less information needs to be stored. Instead of having to store the entire address of a word line for some previous read, only a single bit ($p^B$) needs to be stored. For example, suppose there are M blocks in solid state storage. The number of bits which must be stored by read disturb trigger 660 is (M×4 bits)+(M×1 bits)+(1 bit) where the first term corresponds to all of the $c^B$ counts, the second term corresponds to all of the $p^B$ bits, and the third term corresponds to the $p_{new}$ (i.e., a single $p_{new}$ bit is shared amongst all blocks). When compared against other read disturb techniques which use counters (e.g., one counter per block) that count program and erase (P/E) cycles that go into the millions, this is much less storage.

In addition to requiring less storage, because the counter $c^B$ is relatively small, it is acceptable if the count is lost, for example, because of a power down. As such, it can be stored in volatile memory and does not need to be moved to non-volatile memory if a power down is signaled. Some solid state storage system manufacturers have power down timing requirements which component manufacturers must comply with. Having a shorter list of things to migrate to non-volatile storage would be desirable in such systems because there are fewer things to be backed up before the power down.

Figure 7:
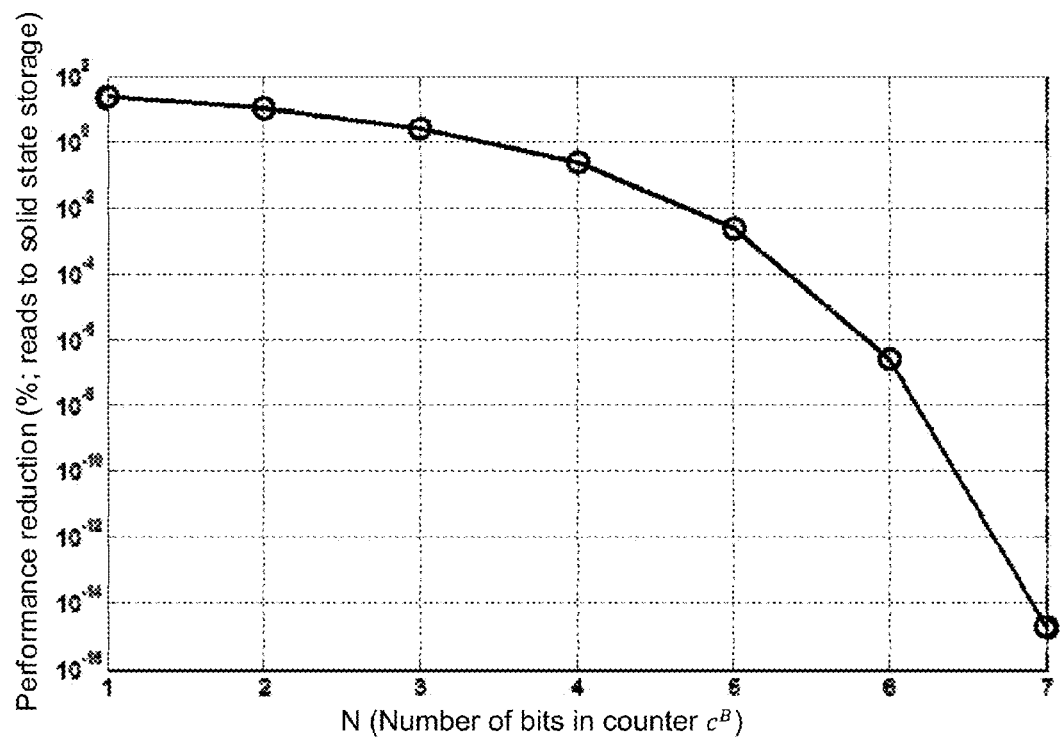
FIG. 7 is a diagram showing an embodiment of performance reduction as a function of the number of bits in a counter.

FIG. 7 is a diagram showing an embodiment of performance reduction as a function of the number of bits in a counter. In the example shown, the counter $c^B$ has N bits. As the number of bits in the counter increases, the performance reduction which comes from having to perform an extra read (e.g., a read not requested by the host) is shown along the y-axis. When N=4, the performance reduction is less than 1%, so a counter which is 4 bits long may be acceptable in some applications. Having a counter which is 4 bits long is much smaller than a 20 bit counter which counts into the millions.

In some embodiments, a count is merely one path by which a read disturb check may be triggered. The following figure shows an example in which there are two paths by which a read disturb check may be triggered.

Figure 8:
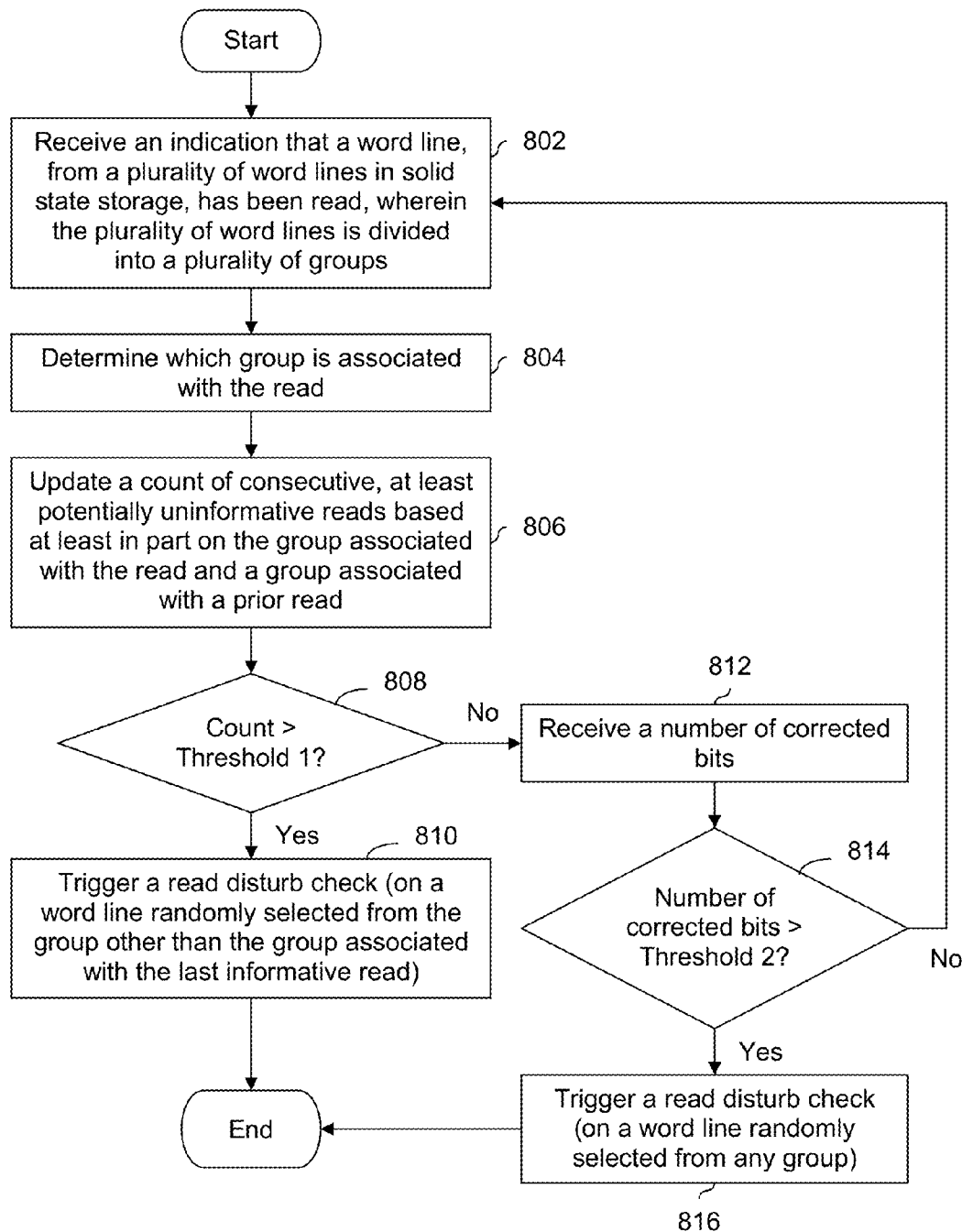
FIG. 8 is a diagram showing an embodiment of a process for triggering a read disturb check based on a count or on a number of corrected bits.

FIG. 8 is a diagram showing an embodiment of a process for triggering a read disturb check based on a count or on a number of corrected bits. At 802, an indication is received that a word line, from a plurality of word lines in solid state storage, has been read, wherein the plurality of word lines is divided into a plurality of groups. For example, even word lines are in one group and odd word lines are in another group. At 804, it is determined which group is associated with the read. At 806, a count of consecutive, at least potentially uninformative reads is updated based at least in part on the group associated with the read and a group associated with a prior read. At 808, it is determined if the count is greater than a first threshold. If so, a read disturb check is triggered at 810, for example, on a word line randomly selected from the group other than the group associated with the last informative read. For example, if $p^B=1$, then a word line from the even group is randomly selected.

If the count is not greater than the first threshold, a number of corrected bits is received at 812. For example, error correction decoding may be performed and the number of corrected bits from that error correction decoding process is received at 812. At 814, it is determined if the number of corrected bits is greater than a second threshold. If so, a read disturb check is triggered at 816, for example, on a word line randomly selected from any group. If not, a next indication is received at 802. In some embodiments, the second threshold used at step 814 is less than a threshold used to detect read disturb (e.g., used by correction based detector 682 in FIG. 6).

To illustrate why in some cases it is desirable to have a second path via which a read disturb check is triggered, consider the following example. Suppose that in FIG. 6, word lines 602a and 602b are MSB read in alternating fashion and word lines 602c and 602d are never read. Word lines 602a and 602b belong to different groups, so the alternating MSB that reads to those word lines causes the counter $c^B$ to reset each time. The counter $c^B$ will never trigger a read disturb check in this scenario, even though read disturb is accumulating with each read on word lines 602c and 602d since they are never read (and to a lesser degree on word lines 602a and 602b with every other MSB read). However, the process shown in FIG. 8 will eventually trigger a read disturb check when the number of corrected bits exceeds the second threshold at 814. The read of word line 602a causes read disturb on word line 602b and vice versa, so eventually the number of corrected bits will exceed the second threshold and cause a read disturb check to be triggered. This example also illustrates why it may be attractive to randomly select a word line from any class at step 816. The bit $p^B$ may have no meaning in the above example, so it may make more sense to select a word line from any group.

Figure 9:
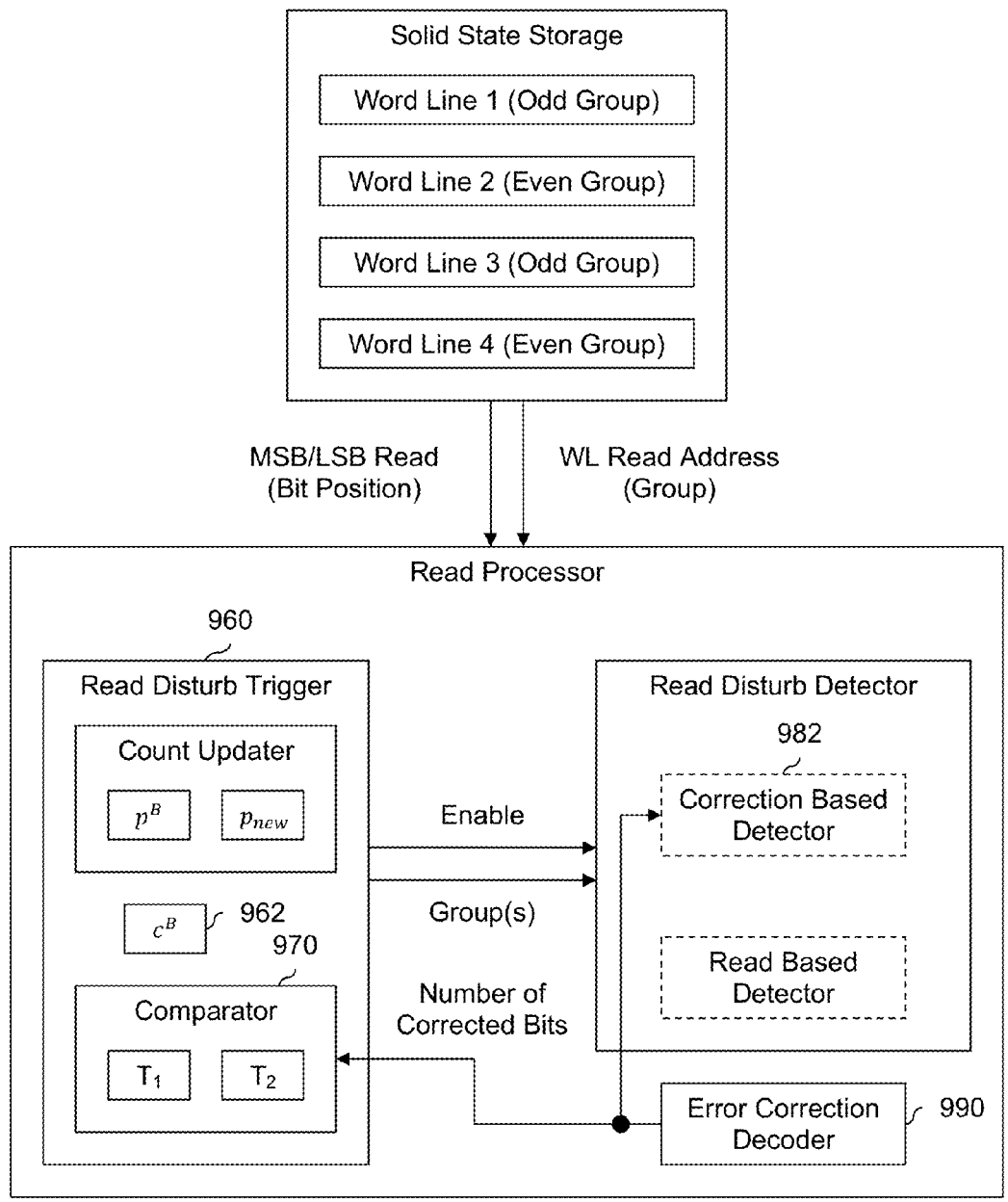
FIG. 9 is a diagram showing an embodiment of a solid state storage system which uses a count of consecutive, at least potentially uninformative reads to trigger read disturb detection, as well as a number of corrected bits.

FIG. 9 is a diagram showing an embodiment of a solid state storage system which uses a count of consecutive, at least potentially uninformative reads to trigger read disturb detection, as well as a number of corrected bits. In the example shown, read disturb trigger 960 performs the process shown in FIG. 8. In the example shown, the enable signal output by read disturb trigger 960 may be asserted based either on count $c^B$ 962 or based on the number of corrected bits output by error correction decoder 990. Comparator 970 includes two thresholds: $T_1$ and $T_2$. The first threshold ($T_1$) is compared against count $c^B$ 962 and the second threshold ($T_2$) is compared against the number of corrected bits. In this example, the number of corrected bits output by error correction decoder 990 is also passed to correction based detector 982.

In this example, depending upon how the enable signal is triggered, different groups on which to perform read disturb detection are signaled by read disturb trigger 960. If a read disturb is triggered based on count $c^B$ 962, the read disturb trigger signals the group opposite of the group associated with a last informative read. For example, if $p^B=0$ then the group output by read disturb trigger 960 is the opposite (i.e., perform a read disturb check on the odd group).

If a read disturb is triggered based on the number of corrected bits, then both the even group and odd group are output by read disturb trigger. In one example, the group signal output by read disturb trigger 960 is a 2-bit signal where one bit is associated with the even group and the other bit is associated with the odd group so that if both bits are asserted, a word line is randomly selected from either group.

Returning to FIG. 1, in some embodiments, the pass voltages (i.e., the voltages applied to word lines which are not being read) are the same. In some other embodiments, different pass voltages are used. The following figures show an example of the latter embodiment and an example of how this may be taken into consideration when selecting a word line for read disturb testing.

Figure 10:
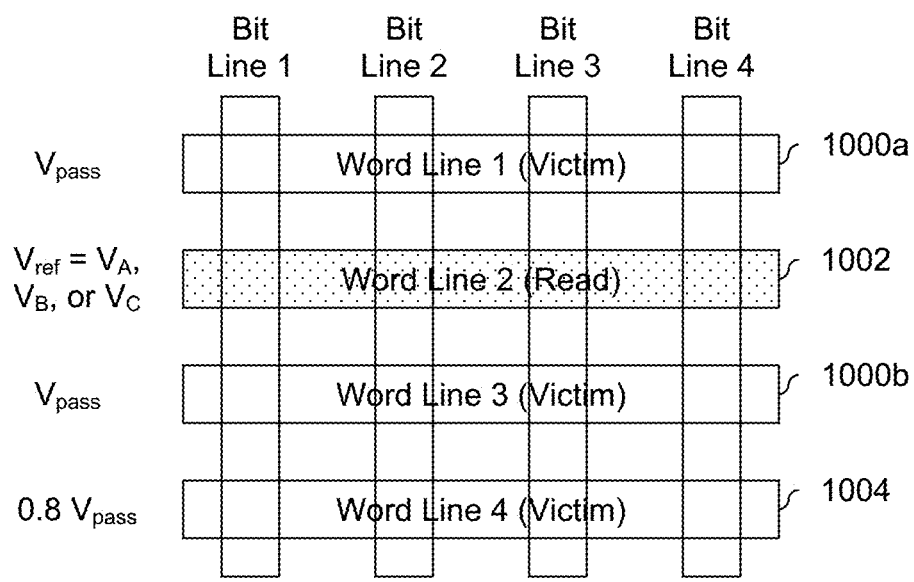
FIG. 10 is a diagram showing an embodiment of unequal pass voltages.

FIG. 10 is a diagram showing an embodiment of unequal pass voltages. In the example shown, word line 1002 is being read. In this system configuration, the word lines which are adjacent to the word line being read are set to a highest pass voltage. As such, word lines 1000a and 1000b are set to pass voltages of $V_{pass}$. All other word lines which are not being read are set to some lower pass voltage. As such, word line 1004 is set to a pass voltage of $0.8\ V_{pass}$.

Figure 11:
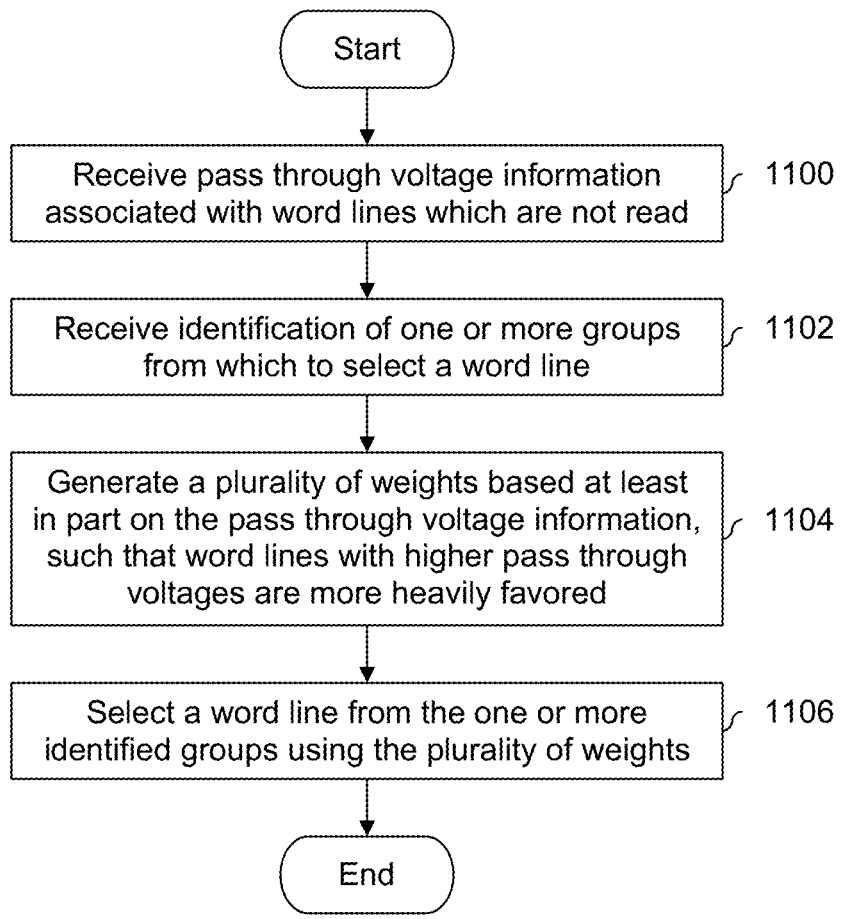
FIG. 11 is a diagram showing an embodiment of a process for selecting a word line using weights based on pass voltages.

FIG. 11 is a diagram showing an embodiment of a process for selecting a word line using weights based on pass voltages. In the example shown, the process is performed in a system where unequal pass voltages are applied to word lines which are not read. One example of this is shown in FIG. 10. In various embodiments, the process of FIG. 11 may be performed during step 405 in FIG. 4, step 810 in FIG. 8, and/or step 816 in FIG. 8.

At 1100, pass voltage information associated with word lines which are not read is received. In one example, an array of scaling factors may be received, where a scaling factor of 0 indicates a word line which is read. Using FIG. 10 as an example, the array [1 0 1 0.8] may be received at 1100.

At 1102, identification of one or more groups from which to select a word line is received. For example, if the process is performed at step 810 in FIG. 8, then the group identified at 1102 would be the group other than the group associated with the last informative read. If, on the other hand, the process is performed at step 814 in FIG. 8, both the even group and odd groups would be identified at 1102.

At 1104, a plurality of weights is generated based at least in part on the pass voltage information, such that word lines with higher pass voltages are more heavily favored. In FIG. 10, for example, the weight for word line 1004 would be lower than the weight for word line 1000a or 1000b. This favors selection of word line 1000a or 1000b (which probably have more read disturb) over word line 1004; it is desirable to check for read disturb on word lines which are likely to have the most read disturb. A word line is selected from the one or more identified groups using the plurality of weights at 1106.

In one example, the last word line read is word line k and this last read is taken into consideration by skewing the probability towards reading word lines (k−1) and (k+1), which are likely to have greater read disturb than others if word line k is being read repeatedly. In this example, if there are M word lines to choose from, the probability of testing word lines (k−1) and (k+1) is set to 1/(M−a) and the probabilities of all other word lines being read set to 1/(M+b) so that word lines (k−1) and (k+1) have a higher probability of being selected for testing.

Figure 12:
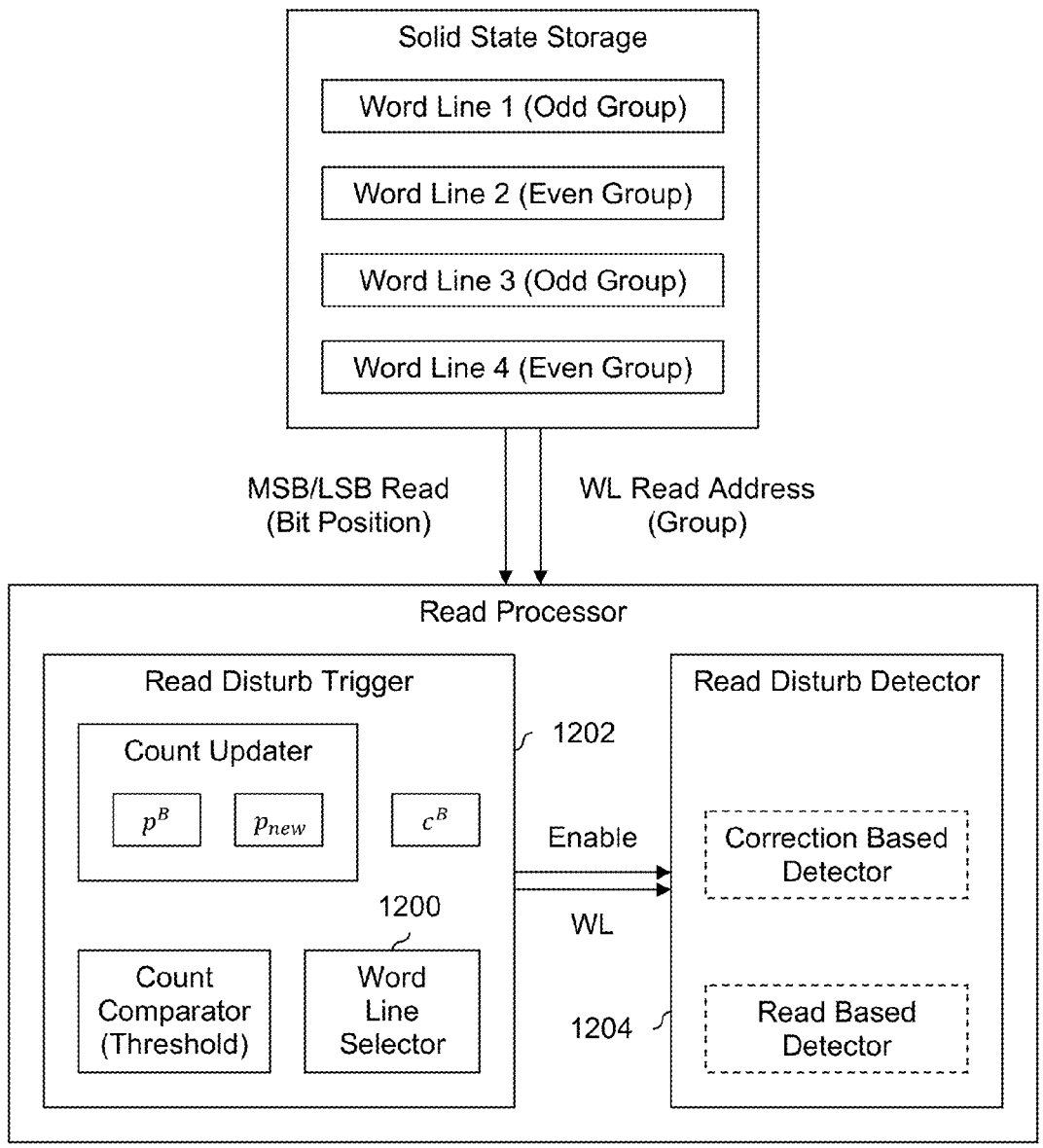
FIG. 12 is a diagram showing an embodiment of a solid state storage system which uses a count of consecutive, at least potentially uninformative reads to trigger read disturb detection on a word line selected based on pass voltage information.

FIG. 12 is a diagram showing an embodiment of a solid state storage system which uses a count of consecutive, at least potentially uninformative reads to trigger read disturb detection on a word line selected based on pass voltage information. FIG. 12 is similar to FIG. 6 and for brevity similar components are not described herein. In the example shown, word line selector 1200 performs the process described in FIG. 11 and selects a word line on which read disturb detection is performed. As such, the word line which is tested is passed from the read disturb trigger 1202 to read disturb detector 1204. Word line selector 1200 selects a word line to perform read disturb detection on. It makes this selected based on the pass voltage information, generates weights which favor selection of word lines with higher pass voltages, and then makes the selection based on the weights.

Figure 13:
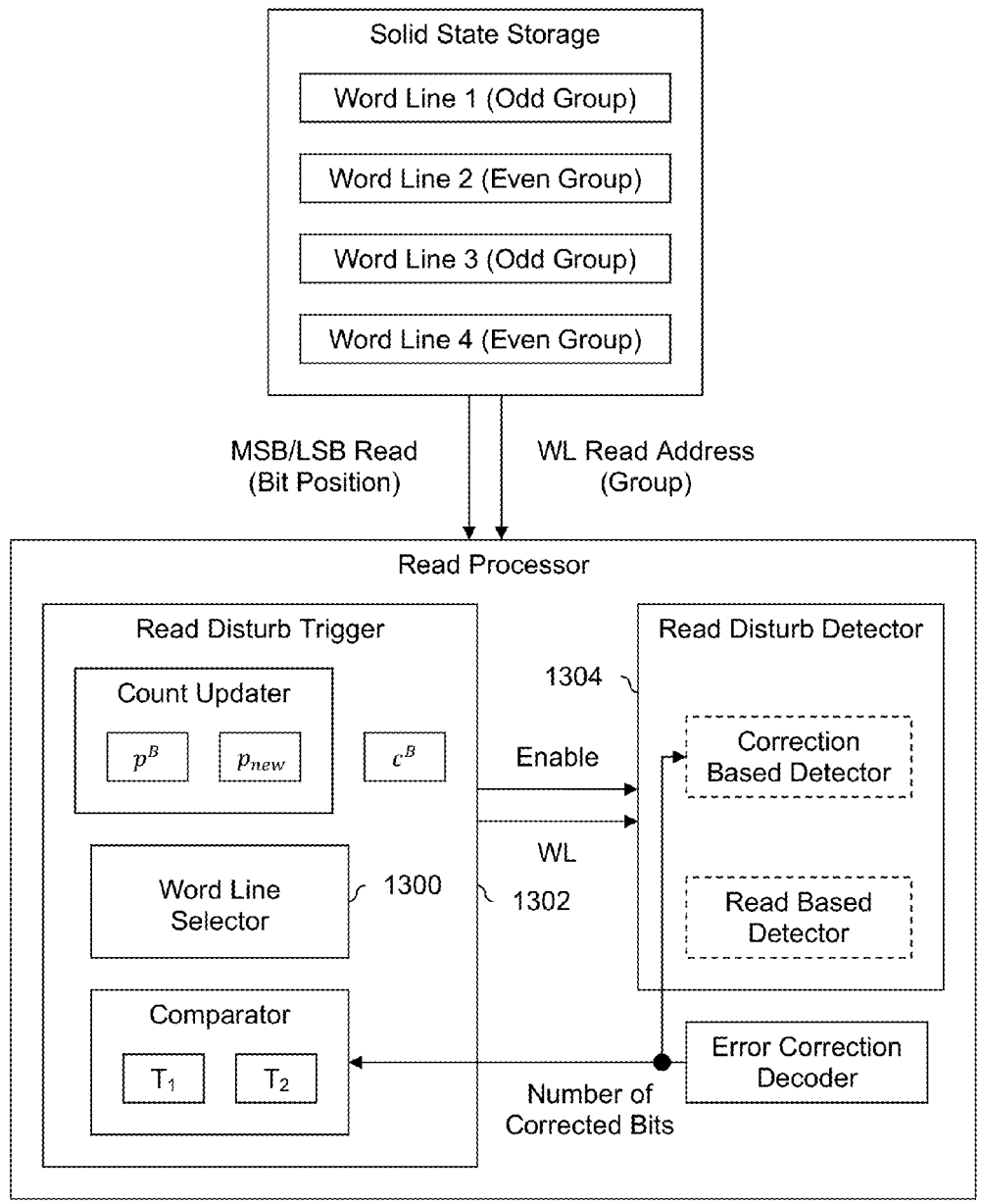
FIG. 13 is a diagram showing an embodiment of a solid state storage system which uses a count of consecutive, at least potentially uninformative reads to trigger read disturb detection, as well as a number of corrected bits, to trigger read disturb detection on a word line selected based on pass voltage information.

FIG. 13 is a diagram showing an embodiment of a solid state storage system which uses a count of consecutive, at least potentially uninformative reads to trigger read disturb detection, as well as a number of corrected bits, to trigger read disturb detection on a word line selected based on pass voltage information. FIG. 13 is similar to FIG. 9 and similar components are not described herein. Word line selector 1300 performs the process shown in FIG. 11. Read disturb trigger 1302 passes this selected word line to read disturb detector 1304 which performs read disturb detection on the indicated word line.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for performing a read disturb check, comprising:
   a count updater configured to:
      receive an indication that a word line, from a plurality of word lines in solid state storage, has been read, wherein the plurality of word lines is divided into a plurality of groups;
      determine which group is associated with the read; and
      update a count based at least in part on the group associated with the read and a group associated with a prior read;
   a count comparator configured to:
      determine if the count is greater than a threshold; and
      in the event it is determined the count is greater than the threshold, trigger a read disturb check; and
   a word line selector configured to select a word line on which the read disturb check is performed, including by:

receiving pass voltage information associated with word lines which are not read;

receiving identification of one or more groups from which to select the word line;

generating a plurality of weights based at least in part on the pass voltage information, such that word lines with higher pass voltages are more heavily favored; and selecting the word line from the one or more identified groups using the plurality of weights.

2. The system of claim 1, wherein the system includes a semiconductor device, including one or more of the following: an application-specific integrated circuit (ASIC) or field-programmable gate array (FPGA).

3. The system of claim 1 further comprising a read disturb detector configured to receive the read disturb check triggered in the event it is determined the count is greater than the threshold.

4. The system of claim 3, wherein the read disturb detector is configured to perform correction based detection, including by:

determining a number of corrected bits; and comparing the number of corrected bits against a second threshold.

5. The system of claim 3, wherein the read disturb detector is configured to perform read based detection, including by:

performing a first read using a first read threshold;

performing a second read using a second read threshold;

determining a number of flipped bits using the first read and the second read; and comparing the number of flipped bits against a second threshold.

6. The system of claim 1, wherein even word lines in the plurality of word lines are assigned to a first group and odd word lines in the plurality of word lines are assigned to a second group.

7. The system of claim 1, wherein updating the count further includes:

determining if a bit position associated with the read is either (1) a bit position associated with a single read threshold or (2) a bit position associated with two or more read thresholds; and in the event it is determined that the bit position associated with the read is a bit position associated with a single read threshold, incrementing the count.

8. The system of claim 7, wherein the count updater is further configured to update the count, including by: in the event it is determined that the bit position associated with the read is a bit position associated with two or more read thresholds:

determining if the group associated with the read is the same as a group associated with a last read to a bit position associated with two or more read thresholds;

in the event it is determining that the group associated with the read is the same as the group associated with the last read to a bit position associated with two or more read thresholds, incrementing the count; and in the event it is determining that the group associated with the read is not the same as the group associated with the last read to a bit position associated with two or more read thresholds:

updating the group associated with the last read to a bit position associated with two or more read thresholds to be the group associated with the read; and resetting the count to be 0.

9. The system of claim 8, wherein even word lines in the plurality of word lines are assigned to a first group and odd word lines in the plurality of word lines are assigned to a second group.

10. The system of claim 1, wherein the count updater is further configured to: in the event it is determined the count is less than or equal to the threshold:

receive a number of corrected bits;

determine if the number of corrected bits is greater than a second threshold; and in the event it is determined that the number of corrected bits is greater than the second threshold, trigger a read disturb check.

11. The system of claim 10, wherein:

the read disturb check triggered by the count is performed on a word line randomly selected from a group other than a group associated with a last informative read; and the read disturb check triggered by the number of corrected bits is performed on a word line randomly selected from any group.

12. A method for performing a read disturb check, comprising:

receiving an indication that a word line, from a plurality of word lines in solid state storage, has been read, wherein the plurality of word lines is divided into a plurality of groups;

determining which group is associated with the read;

using a processor to update a count based at least in part on the group associated with the read and a group associated with a prior read;

determining if the count is greater than a threshold;

in the event it is determined the count is greater than the threshold, triggering a read disturb check; and selecting a word line on which the read disturb check is performed, including by:

receiving pass voltage information associated with word lines which are not read;

receiving identification of one or more groups from which to select the word line;

generating a plurality of weights based at least in part on the pass voltage information, such that word lines with higher pass voltages are more heavily favored; and selecting the word line from the one or more identified groups using the plurality of weights.

13. The method of claim 12, wherein the processor includes a semiconductor device, including one or more of the following: an application-specific integrated circuit (ASIC) or field-programmable gate array (FPGA).

14. The method of claim 12 further comprising performing the read disturb check.

15. The method of claim 14, wherein performing the read disturb check includes performing correction based detection, including by:

determining a number of corrected bits; and comparing the number of corrected bits against a second threshold.

16. The method of claim 14, wherein performing the read disturb check includes performing read based detection, including by:

performing a first read using a first read threshold;

performing a second read using a second read threshold;

determining a number of flipped bits using the first read and the second read; and comparing the number of flipped bits against a second threshold.

17. The method of claim 12, wherein even word lines in the plurality of word lines are assigned to a first group and odd word lines in the plurality of word lines are assigned to a second group.

18. The method of claim 12, wherein:
the group associated with the prior read includes a group associated with a last informative read; and
updating the count includes:
determining a bit position associated with the read;
determining if the bit position corresponds to an informative read; and
in the event it is determined that the bit position corresponds to an informative read, incrementing the count.

19. The method of claim 18, wherein updating the count further includes: in the event it is determined that the bit position does not correspond to an informative read:
determining if the group associated with the read is the same as the group associated with the last informative read;
in the event it is determining that the group associated with the read is the same as the group associated with the last informative read, incrementing the count; and
in the event it is determining that the group associated with the read is not the same as the group associated with the last informative read:
updating the group associated with the last informative read to be the group associated with the read; and
resetting the count to be 0.

20. The method of claim 19, wherein even word lines in the plurality of word lines are assigned to a first group and odd word lines in the plurality of word lines are assigned to a second group.

21. The method of claim 12, wherein the count updater is further configured to: in the event it is determined the count is less than or equal to the threshold:
receive a number of corrected bits;
determine if the number of corrected bits is greater than a second threshold; and
in the event it is determined that the number of corrected bits is greater than the second threshold, trigger a read disturb check.

22. The method of claim 21, wherein:
the read disturb check triggered by the count is performed on a word line randomly selected from a group other than a group associated with a last informative read; and
the read disturb check triggered by the number of corrected bits is performed on a word line randomly selected from any group.

23. A computer program product for performing a read disturb check, the computer program product being embodied in a non-transitory computer readable storage medium and comprising computer instructions for:
receiving an indication that a word line, from a plurality of word lines in solid state storage, has been read, wherein the plurality of word lines is divided into a plurality of groups;
determining which group is associated with the read;
updating a count based at least in part on the group associated with the read and a group associated with a prior read;
determining if the count is greater than a threshold;
in the event it is determined the count is greater than the threshold, triggering a read disturb check; and
selecting a word line on which the read disturb check is performed, including by:
receiving pass voltage information associated with word lines which are not read;
receiving identification of one or more groups from which to select the word line;
generating a plurality of weights based at least in part on the pass voltage information, such that word lines with higher pass voltages are more heavily favored; and
selecting the word line from the one or more identified groups using the plurality of weights.

24. The method of claim 12, wherein updating the count further includes:
determining if a bit position associated with the read is either (1) a bit position associated with a single read threshold or (2) a bit position associated with two or more read thresholds; and
in the event it is determined that the bit position associated with the read is a bit position associated with a single read threshold, incrementing the count.

25. The method of claim 24, wherein updating the count further includes: in the event it is determined that the bit position associated with the read is a bit position associated with two or more read thresholds:
determining if the group associated with the read is the same as a group associated with a last read to a bit position associated with two or more read thresholds;
in the event it is determining that the group associated with the read is the same as the group associated with the last read to a bit position associated with two or more read thresholds, incrementing the count; and
in the event it is determining that the group associated with the read is not the same as the group associated with the last read to a bit position associated with two or more read thresholds:
updating the group associated with the last read to a bit position associated with two or more read thresholds to be the group associated with the read; and
resetting the count to be 0.

26. The computer program product of claim 23, wherein even word lines in the plurality of word lines are assigned to a first group and odd word lines in the plurality of word lines are assigned to a second group.

27. The computer program product of claim 23, wherein updating the count further includes:
determining if a bit position associated with the read is either (1) a bit position associated with a single read threshold or (2) a bit position associated with two or more read thresholds; and
in the event it is determined that the bit position associated with the read is a bit position associated with a single read threshold, incrementing the count.

* * * * *